(12) United States Patent
Koh

(10) Patent No.: US 7,351,631 B2
(45) Date of Patent: Apr. 1, 2008

(54) FLASH MEMORIES AND METHODS OF FABRICATING THE SAME

(75) Inventor: Kwan-Ju Koh, Bucheon (KR)

(73) Assignee: Dongbu Electronics Co., Ltd. (KR)

( * ) Notice: Subject to any disclaimer, the term of this patent is extended or adjusted under 35 U.S.C. 154(b) by 0 days.

(21) Appl. No.: 11/650,216

(22) Filed: Jan. 3, 2007

(65) Prior Publication Data

US 2007/0111445 A1 May 17, 2007

Related U.S. Application Data

(62) Division of application No. 10/915,892, filed on Aug. 11, 2004, now Pat. No. 7,176,517.

(30) Foreign Application Priority Data

Aug. 12, 2003 (KR) ...................... 10-2003-0055791

(51) Int. Cl.
*H01L 21/8238* (2006.01)
(52) U.S. Cl. ................ 438/211; 438/257; 257/E21.422
(58) Field of Classification Search ................ 438/211, 438/257; 257/E21.422
See application file for complete search history.

(56) References Cited

U.S. PATENT DOCUMENTS

| 5,950,087 | A | 9/1999 | Hsieh et al. |
| 5,989,960 | A | 11/1999 | Fukase |
| 6,151,248 | A | 11/2000 | Harari et al. |
| 6,204,126 | B1 | 3/2001 | Hsieh et al. |
| 6,528,843 | B1 | 3/2003 | Wu |
| 6,570,213 | B1 | 5/2003 | Wu |

FOREIGN PATENT DOCUMENTS

KR 1020020045434 A 6/2002

*Primary Examiner*—Phat X Cao
(74) *Attorney, Agent, or Firm*—Andrew D. Fortney

(57) ABSTRACT

The present disclosure relates to a flash memory including a common source line having a predetermined width formed on a semiconductor substrate, a common source in the semiconductor substrate below the common source line, and a couple of floating gates having a predetermined width formed on both outer side walls of the common source line. The flash memory may also include a couple of tunneling oxide layers formed between the floating gate and the common source line, and between the floating gate and the semiconductor substrate, a couple of dielectric layers formed on each of the couple of floating gates, and a couple of control gates formed on each of the couple of dielectric layers. Further, the flash memory may include a couple of drains formed in the semiconductor substrate by injecting impurity ions in using the control gate and the common source line as a mask.

16 Claims, 3 Drawing Sheets

FLASH MEMORIES AND METHODS OF FABRICATING THE SAME

CROSS REFERENCE TO RELATED APPLICATIONS

This application is a divisional of U.S. patent application Ser. No. 10/915,892, filed Aug. 11, 2004, now U.S. Pat. No. 7,176,517. This application also claims priority to and the benefit of Korean Patent Application No. 2003-0055791, filed on Aug. 12, 2003 in the Korean Intellectual Property Office, the entire content of which is incorporated herein by reference.

TECHNICAL FIELD

The present disclosure relates to semiconductor memories, and in particular, to flash memories and methods of fabricating the same.

BACKGROUND

Generally, semiconductor memory devices are divided into a volatile memory devices and a non-volatile memory devices. Example volatile memory device include random access memory (RAM), dynamic RAM (DRAM), and static RAM (SRAM). Volatile memory devices are characterized in that data stored in volatile memory devices is erased when power is removed from the volatile memory device.

As opposed to volatile memory devices, non-volatile memory devices, such as read only memory (ROM) retain their contents when power is removed from the non-volatile memory devices.

Currently, non-volatile memory devices are divided into floating gate based memory and metal insulator semiconductor (MIS) based memory. Floating gate based memory devices operate using a potential well. Typical floating gate based memory devices include an erasable programmable read only memory (EPROM) tunnel oxide (ETOX) structure that is applied as a flash electrically erasable programmable read only memory (EEPROM).

MIS based memory is characterized in that such devices include two or more kinds of dielectric layers that are stacked to form a double layer or a triple layer device. MIS based memory devices utilize a trap that exists in an interface between the dielectric bulk and the dielectric layer, and between the dielectric layer and the semiconductor. Example MIS based memory devices include metal oxide-nitride-oxide semiconductor (MONOS) and silicon oxide-nitride-oxide semiconductor (SONOS) structures that are applied as electrically erasable programmable read only memory (EEPROM).

A conventional flash memory having the oxide-nitride-oxide (ONO) structure is illustrated in FIG. 1. As shown in FIG. 1, a tunneling oxide layer 2 having a predetermined width and a thickness of about 100 Å is formed on a semiconductor substrate 1. A floating gate 3 formed of polycrystalline silicon and having a thickness of about 2500 Å is formed thereon. A dielectric layer 4 of an ONO structure is formed on the floating gate 3.

A control gate 5 formed of polycrystalline silicon and having a thickness of about 2500 Å is formed on the dielectric layer 4. A side wall 6 is formed on both side wall of the control gate 5, the dielectric layer 4, the floating gate 3, and the tunneling oxide layer 2.

A source 7 and a drain 8 are formed in the semiconductor substrate 1 located outside of the control gate 5, the dielectric layer 4, the floating gate 3 and the tunneling oxide layer 2.

Technical development for reducing the size of the flash memory as described above is currently being undertaken, however, there is still a limitation on reducing the device size. For example, mass production of an ultra fine silicon device needing an ultra fine pattern cannot realized because there is no settled technique using a new process for forming patterns, such as an exposure method using an electron beam or an X-ray to fabricate a nano-sized channel of the device.

DETAILED DESCRIPTION

The flash memory and the method for fabricating the flash memory according to a preferred embodiment of the present invention will be described in detail.

Figure 1:
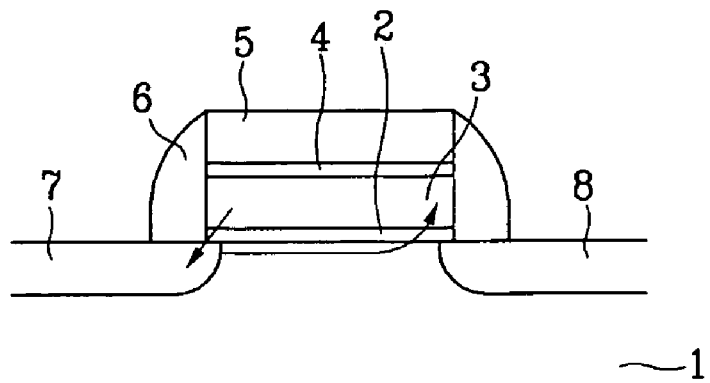
FIG. 1 is a cross sectional view illustrating a conventional flash memory.
Figure 2A:
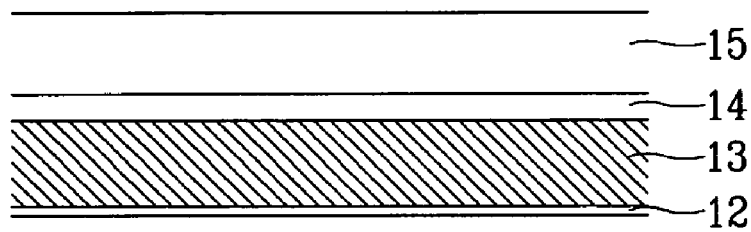
FIGS. 2A to 2F show cross sectional views illustrating various stages of fabrication of a flash memory according to the present disclosure.
Figure 2B:
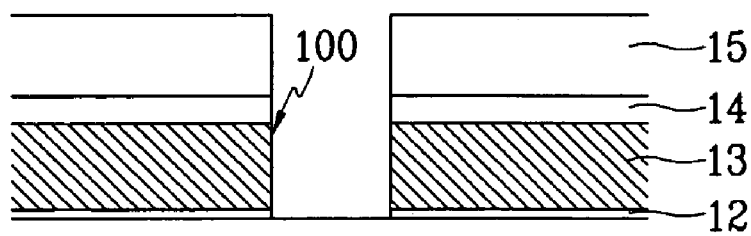
Figure 2C:
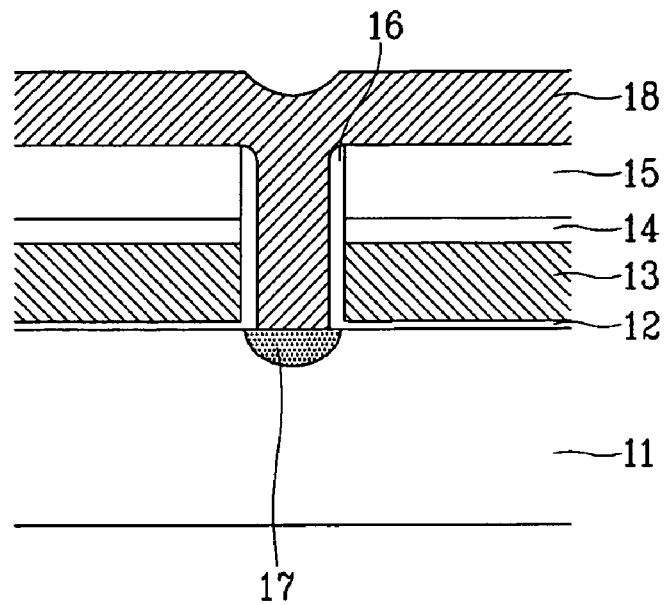
Figure 2D:
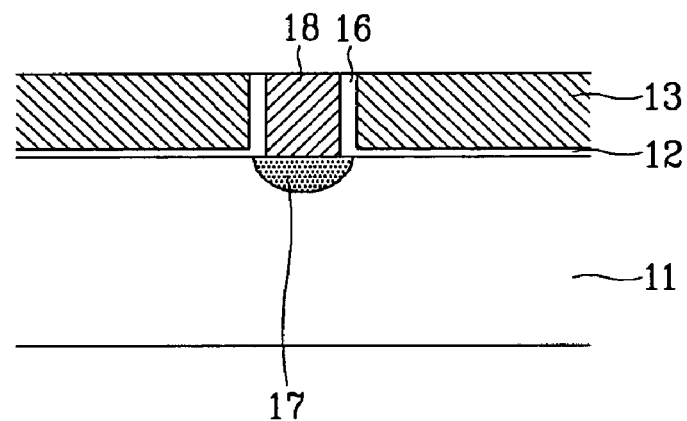
Figure 2E:
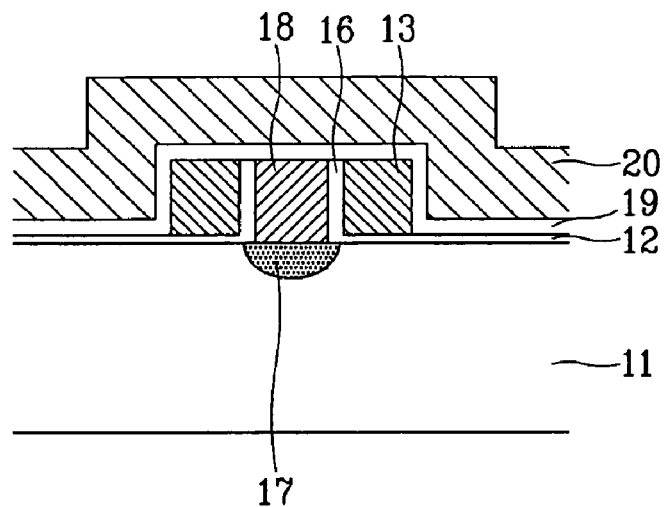
Figure 2F:
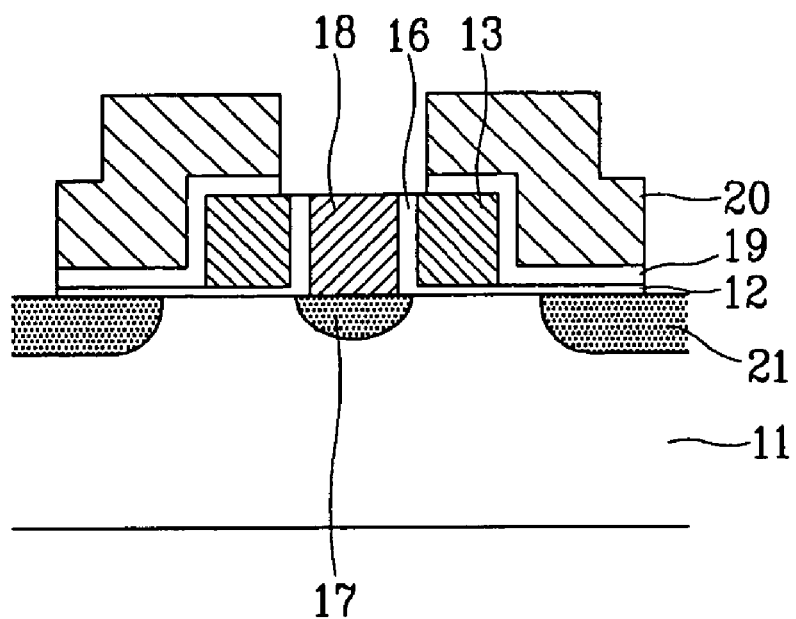

With reference to FIG. 2F, a common source line 18 having a predetermined width is formed on a semiconductor substrate 11. The common source line 18 may be, for example, formed of a conductive material, such as impurity-doped polycrystalline silicon. A common source 17 is formed in the semiconductor substrate below the common source line 18.

A number of floating gates 13 having a predetermined width are formed on both outer side walls of the common source line 18. According to one example there may be a couple of floating gates 13 forms proximate the common source line 18. A couple of tunneling oxide layers 12, 16 are formed between the floating gate 13 and the common source line 18, and between the floating gate 13 and the semiconductor substrate 11. According to one example, the tunneling oxide layer 12, 16 can be formed on the semiconductor substrate outside of the floating gate 13.

A couple of dielectric layers 19 are formed on each of the floating gates 13. The dielectric layer 19 can be formed on the tunneling oxide layer 12. A couple of control gates 20 are formed on each of the couple of the dielectric layer 19.

Further, a couple of drains 21 are formed in the semiconductor substrate 11 by injecting impurity ions therein using the control gate 20 and the common source line 18 as a mask.

As disclosed herein, floating gates 13, dielectric layers 19, control gates 20, and drains 21 are formed on each side of the common source line 18, thereby forming couples.

Hereafter, a contact for applying an electric signal is formed on each of the couple of the control gate 20. A metal line is connected through the contact.

In the flash memory as described above, when a proper voltage is applied to the control gate 20 for operating the device, carriers move from the common source 17 to each of the drains 21 to result in the flow of electricity.

The flow of electricity to each of the drains, that is, an electric signal in each of the drains, is independently controlled by controlling the applying voltage into the control gate 20. For example, it is possible to make an OFF signal in the right drain and to make an ON signal in the left drain.

The method for fabricating the flash memory as describe above is explained in detail as follows.

First, as shown in FIG. 2A, a first tunneling oxide layer 12, a floating gate 13, and sacrificial layers 14, 15 are sequentially formed on a semiconductor substrate 11.

According to one implementation, the floating gate 13 may be polycrystalline silicon, and the sacrificial layers may be nitride and oxide layers, respectively.

The sacrificial layers 14, 15 are selectively formed to protect the floating gate 13 in a process of injecting impurity ions for forming a common source. The nitride layer 14 of the sacrificial layer acts as an etch-stop layer in the process of chemical mechanical polishing as described below.

Next, as shown in FIG. 2B, portions of the sacrificial layers 14, 15, the floating gate 13, and the first tunneling oxide layer 12 are selectively etched to form a window 100 exposing the semiconductor substrate 11.

As shown in FIG. 2C, subsequently a second tunneling oxide layer 16 is formed on both inner side walls of the window 100 to connect the first tunneling oxide layer 12 with the second tunneling oxide layer 16. One example for forming the second tunneling oxide layer 16 is that the second tunneling oxide layer is deposited over the semiconductor substrate 11 including the window 100 and then etched by etch-back process.

Next, a process of injecting impurity ions is performed over the semiconductor substrate 11 to form a common source 17 in the semiconductor substrate 11 exposed through the window 100.

A conductive material for the common source line 18 is deposited over the semiconductor substrate 11 to fill into the window 100. As the conductive material for the common source line 18, impurity-doped polycrystalline silicon can be formed. The impurity-doped polycrystalline silicon can be formed by depositing polycrystalline silicon and then injecting impurity ions into the polycrystalline silicon, or can be formed by simultaneously performing the deposition of the polycrystalline silicon and the injection of the impurity ions.

Next, as shown in FIG. 2D, the conductive material for the common source line 18 and the sacrificial layer 14, 15 are removed by chemical mechanical polishing while using the nitride layer 14 as an etch-stop layer until the floating gate 13 is exposed. In result, the second tunneling oxide layer 16 remains having a predetermined height, and the common source line 18 is formed to be filled into the window 100 and to have the same height with the second tunneling oxide layer 16.

As shown in FIG. 2E, subsequently the floating gate 13 is selectively etched to be a couple of floating gates on both outer side walls of the common source line 18. Each of the couple of the floating gates 13 has a predetermined width.

Next, a dielectric layer 19 and a control gate 20 are sequentially formed over the semiconductor substrate 11.

According to one example, the dielectric layer 19 may be an ONO structure including a first oxide layer, a nitride layer, and a second oxide layer. The control gate 20 may be fabricated from polycrystalline silicon Next, as shown in FIG. 2F, the control gate 20, the dielectric layer 19, and the first tunneling oxide layer 12 are selectively etched to have a predetermined width covering portions of the semiconductor substrate 11 and to expose the common source line 18. Here, the dielectric layer 19 and the control gate 20 are formed to be step-shaped covering the floating gate 13 and portions of the semiconductor substrate 11 neighboring the floating gate 13.

Finally, a couple of drains 21 are formed by injecting impurity ions into the semiconductor substrate 11 in using the control gate 20 and the common source line 18 as a mask. As a result, the couple of drains 21 are formed in the semiconductor substrate 11 located outside of the control gate 20.

As described above, the disclosed techniques, devices, and processes are designed to provide a flash memory having a reduced size. Accordingly, the methods disclosed herein include sequentially forming a first tunneling oxide layer and a floating gate on a semiconductor substrate, etching portions of the floating gate and the first tunneling oxide layer to form a window exposing the semiconductor substrate, and forming a second tunneling oxide layer on both inner side walls of the window. The method may also include forming a common source in the semiconductor substrate being exposed through the window, forming a common source line by filling a conductive material into the window, and selectively etching the floating gate to leave a couple of the floating gates on both outer side walls of the common source line, the couple of floating gates having a predetermined width. Subsequently, the method may include sequentially forming a dielectric layer and a control gate over each of the floating gates and forming a couple of drains by injecting impurity ions into the semiconductor substrate while using the control gate and the common source line as a mask.

As disclosed herein, forming the common source line may include forming the conductive material over the semiconductor substrate to fill into the window; and removing the conductive material to expose the floating gate.

Additionally, methods for fabricating a flash memory may include forming a sacrificial layer on the floating gate and then performing the etching to form the window, wherein the sacrificial layer is removed in the forming the common source line. Further, forming the common source line may include forming the conductive material over the semiconductor substrate to fill into the window and removing the conductive material by chemical mechanical polishing until the floating gate is exposed.

In the foregoing examples, the sacrificial layer may include sequentially formed nitride and oxide layers. The nitride layer may be used as an etch-stop layer in the chemical mechanical polishing of the conductive material. The conductive material may be formed out of an impurity-doped polycrystalline silicon. The impurity-doped polycrystalline silicon may be formed by depositing a polycrystalline silicon and then injecting impurity ions into the polycrystalline silicon, or is formed by simultaneously performing the deposition of the polycrystalline silicon and the injection of the impurity ions.

The dielectric layer may include sequentially formed a first oxide layer, a nitride layer, and a second oxide layer.

The dielectric layer may be formed to cover the floating gate and the first tunneling oxide layer.

Forming the dielectric layer and the control gate may include forming the dielectric layer and the control gate over the semiconductor substrate and etching the dielectric layer and the control gate selectively to expose the common gate line and cover the floating gate and portions of the semiconductor substrate. The dielectric layer and the control gate over each of the floating gate may be formed to be step-shaped covering the floating gate and portions of the semiconductor substrate.

Further, the present disclosure describes a flash memory including a common source line having a predetermined width formed on a semiconductor substrate, a common source in the semiconductor substrate below the common source line, and a couple of floating gates having a predetermined width formed on both outer side walls of the common source line. The flash memory may further include a couple of tunneling oxide layers formed between the floating gate and the common source line, and between the floating gate and the semiconductor substrate, a couple of dielectric layers formed on each of the couple of floating gates, and a couple of control gates formed on each of the couple of dielectric layers. Additionally, the flash memory may include a couple of drains formed in the semiconductor substrate by injecting impurity ions in using the control gate and the common source line as a mask.

The tunneling oxide layer may be formed between the floating gate and the common source line, between the floating gate and the semiconductor substrate, and on the semiconductor substrate outside of the floating gate. The dielectric layer and the control gate may be formed to have a predetermined width. An electric signal in each of the drains may be independently controlled.

Although certain apparatus constructed in accordance with the teachings of the invention have been described herein, the scope of coverage of this patent is not limited thereto. On the contrary, this patent covers every apparatus, method and article of manufacture fairly falling within the scope of the appended claims either literally or under the doctrine of equivalents.

What is claimed is:

1. A method for fabricating a flash memory comprising:
   sequentially forming a first tunneling oxide layer and a floating gate on a semiconductor substrate;
   etching portions of the floating gate and the first tunneling oxide layer to form a window exposing the semiconductor substrate;
   forming a second tunneling oxide layer on inner side walls of the window;
   injecting impurity ions in the semiconductor substrate exposed through the window to form a common source;
   filling a conductive material into the window;
   chemical mechanical polishing to remove the conductive material, expose the floating gate, and form a common source line having a same height as the second tunneling oxide layer;
   selectively etching the floating gate to leave floating gates on outer side walls of the second tunneling oxide layer, the floating gates having a predetermined width;
   sequentially forming a dielectric layer and a control gate over the floating gates; and
   forming drains by injecting impurity ions into the semiconductor substrate using the control gate and the common source line as a mask.

2. The method as defined by claim 1, further comprising:
   forming a sacrificial layer on the floating gate and then etching to form the window, and removing the sacrificial layer before forming the common source line.

3. The method as defined by claim 2 wherein the forming common source line comprises:
   forming the conductive material over the semiconductor substrate to fill into the window.

4. The method as defined by claim 2, wherein forming the sacrificial layer comprises sequentially forming a nitride layer and an oxide layer.

5. The method as defined by claim 4, wherein the nitride layer is a stop layer in the chemical mechanical polishing of the conductive material.

6. The method as defined by claim 1, wherein the conductive material comprises an impurity-doped polycrystalline silicon.

7. The method as defined by claim 6, wherein forming the impurity-doped polycrystalline silicon comprises depositing silicon and then injecting impurity ions into the silicon, or simultaneously depositing silicon and injecting the impurity ions.

8. The method as defined by claim 1, wherein forming the dielectric layer comprises sequentially forming a first oxide layer, a nitride layer, and a second oxide layer.

9. The method as defined by claim 1, wherein the dielectric layer covers the floating gate and the first tunneling oxide layer.

10. The method as defined by claim 1, wherein forming the dielectric layer and the control gate comprises:
    forming the dielectric layer and the control gate over the semiconductor substrate; and
    etching the dielectric layer and the control gate selectively to expose the common source line and cover the floating gate and portions of the semiconductor substrate.

11. The method as defined by claim 10, wherein the dielectric layer and the control gate are step-shaped over the floating gate and portions of the semiconductor substrate.

12. A method for fabricating a flash memory comprising:
    sequentially forming a first tunneling oxide layer and a floating gate on a semiconductor substrate;
    etching portions of the floating gate and the first tunneling oxide layer to form a window exposing the semiconductor substrate;
    forming a second tunneling oxide layer on inner side walls of the window;
    forming a common source in the semiconductor substrate exposed through the window;
    forming a common source line by filling a conductive material into the window;
    selectively etching the floating gate to leave floating gates on outer side walls of the second tunneling oxide layer, the floating gates having a predetermined width;
    sequentially forming a dielectric layer and a control gate over the floating gates and over the semiconductor substrate;
    etching the dielectric layer and the control gate selectively to expose the common source line and cover the floating gate and portions of the semiconductor substrate; and
    forming drains by injecting impurity ions into the semiconductor substrate using the control gate and the common source line as a mask.

13. The method as defined by claim 12, wherein forming the common source line further comprises removing excess conductive material by chemical mechanical polishing until the floating gate is exposed.

14. The method as defined by claim 13, wherein the common source line has a same height as the second tunneling oxide layer.

15. The method as defined by claim 12, wherein forming the common source comprises injecting impurity ions in the semiconductor substrate.

16. The method as defined by claim 12, wherein forming the common source line comprises depositing the conductive material over the semiconductor substrate sufficiently to fill the window, then chemical mechanical polishing the conductive material and the sacrificial layer until the floating gate is exposed.

* * * * *